(12) United States Patent
Chang

(10) Patent No.: US 12,315,839 B2
(45) Date of Patent: May 27, 2025

(54) WAFER BONDING DEVICE AND WAFER BONDING METHOD

(71) Applicant: CHANGXIN MEMORY TECHNOLOGIES, INC., Hefei (CN)

(72) Inventor: Chih-Wei Chang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 411 days.

(21) Appl. No.: 17/805,166

(22) Filed: Jun. 2, 2022

(65) Prior Publication Data

US 2023/0223377 A1 Jul. 13, 2023

Related U.S. Application Data

(63) Continuation of application No. PCT/CN2022/076170, filed on Feb. 14, 2022.

(30) Foreign Application Priority Data

Jan. 11, 2022 (CN) .......................... 202210026823.6

(51) Int. Cl.
*H01L 23/00* (2006.01)
*G03F 9/00* (2006.01)

(52) U.S. Cl.
CPC ................ *H01L 24/80* (2013.01); *G03F 9/70* (2013.01); *H01L 24/74* (2013.01); *H01L 2224/80035* (2013.01); *H01L 2224/8013* (2013.01); *H01L 2224/80894* (2013.01); *H01L 2224/80908* (2013.01)

(58) Field of Classification Search
None
See application file for complete search history.

(56) References Cited

U.S. PATENT DOCUMENTS

| 5,048,968 A | 9/1991 | Suzuki |
| 2019/0393067 A1 | 12/2019 | Wang et al. |
| 2020/0227298 A1 | 7/2020 | Wang et al. |
| 2021/0313211 A1* | 10/2021 | Yamauchi .............. H05K 13/04 |

FOREIGN PATENT DOCUMENTS

| CN | 104748702 A | 7/2015 |
| CN | 107331643 A | 11/2017 |
| CN | 110491806 A | 11/2019 |

(Continued)

*Primary Examiner* — Barbara J Musser
(74) *Attorney, Agent, or Firm* — Syncoda LLC; Feng Ma

(57) ABSTRACT

A wafer bonding device includes: a first fixing apparatus fixing a first wafer, on which a first alignment mark is disposed; a second fixing apparatus fixing a second wafer, on which a second alignment mark is disposed, the second fixing apparatus being disposed opposite to the first fixing apparatus; a reflection member between the first and second fixing apparatuses; a mark reader which reads position information about the first and second alignment marks by means of the reflection member, for aligning the first wafer with the second wafer; and a heating apparatus, configured to heat the first wafer or the second wafer to thermally expand the first wafer or the second wafer so that the first alignment mark or the second alignment mark is located at a central position of a field of view of the mark reader. A wafer bonding method also is involved.

14 Claims, 8 Drawing Sheets

(56) References Cited

FOREIGN PATENT DOCUMENTS

| | | | |
|---|---|---|---|
| CN | 110634728 | A | 12/2019 |
| CN | 110752177 | A | 2/2020 |
| CN | 111584415 | A | 8/2020 |
| CN | 112018002 | A | 12/2020 |
| CN | 112640067 | A | 4/2021 |
| CN | 213042878 | U | 4/2021 |
| JP | H1124753 | A | 1/1999 |
| JP | 2010272707 | A | 12/2010 |

* cited by examiner

WAFER BONDING DEVICE AND WAFER BONDING METHOD

CROSS-REFERENCE TO RELATED APPLICATIONS

This is a continuation application of International Patent Application No. PCT/CN2022/076170 filed on Feb. 14, 2022, which claims priority to Chinese Patent Application No. 202210026823.6 filed on Jan. 11, 2022. The disclosures of these applications are hereby incorporated by reference in their entirety.

BACKGROUND

A semiconductor bonding technology refers to a technology of directly bonding two pieces of homogeneous or heterogeneous semiconductor materials after surface cleaning and activation treatment under certain conditions, and bonding wafers into one piece by Van der Waals force, molecular force or even atomic force. In the wafer bonding technology, wafer alignment accuracy and distortion of the bonded wafer are important parameters to characterize the quality of a wafer bonding process. If there is a defect in the alignment accuracy in the wafer bonding process, the back-end-of-line will be seriously affected, then the connection and functionality of a circuit after wafers are bonded will be affected, and the wafer yield will be reduced. Therefore, the wafer alignment accuracy is particularly critical.

SUMMARY

The present disclosure relates to the technology of wafer packaging processing, and particularly to a wafer bonding device and a wafer bonding method.

Embodiments of the disclosure provide a wafer bonding device and a wafer bonding method.

According to a first aspect of the embodiments of the disclosure, there is provided a wafer bonding device, which may include a first fixing apparatus, a second fixing apparatus, a reflection member, a mark reader, and a heating apparatus.

The first fixing apparatus is configured to fix a first wafer. A first alignment mark is disposed on the first wafer.

The second fixing apparatus is configured to fix a second wafer. A second alignment mark is disposed on the second wafer. The second fixing apparatus is disposed opposite to the first fixing apparatus.

The reflection member is located between the first fixing apparatus and the second fixing apparatus.

The mark reader reads position information about the first alignment mark and the second alignment mark by means of the reflection member, for aligning the first wafer fixed on the first fixing apparatus with the second wafer fixed on the second fixing apparatus.

The heating apparatus is configured to heat the first wafer to thermally expand the first wafer so that the first alignment mark is located at a central position of a field of view of the mark reader; or, to heat the second wafer to thermally expand the second wafer so that the second alignment mark is located at a central position of a field of view of the mark reader.

According to a second aspect of the embodiments of the disclosure, there is provided a wafer bonding method implemented by a device as described in any of the above embodiments, which may include the following operations.

A first wafer, on which a first alignment mark is disposed, is fixed to a first fixing apparatus.

A second wafer, on which a second alignment mark is disposed, is fixed to a second fixing apparatus. The second fixing apparatus is disposed opposite to the first fixing apparatus.

A reflection member is disposed between the first fixing apparatus and the second fixing apparatus.

A mark reader reads position information about the first alignment mark and the second alignment mark by means of the reflection member.

The first wafer is heated using a heating apparatus to thermally expand the first wafer so that the first alignment mark is located at a central position of a field of view of the mark reader; or the second wafer is heated using a heating apparatus to thermally expand the second wafer so that the second alignment mark is located at a central position of a field of view of the mark reader.

DESCRIPTION OF REFERENCE NUMERALS

Figure 1:
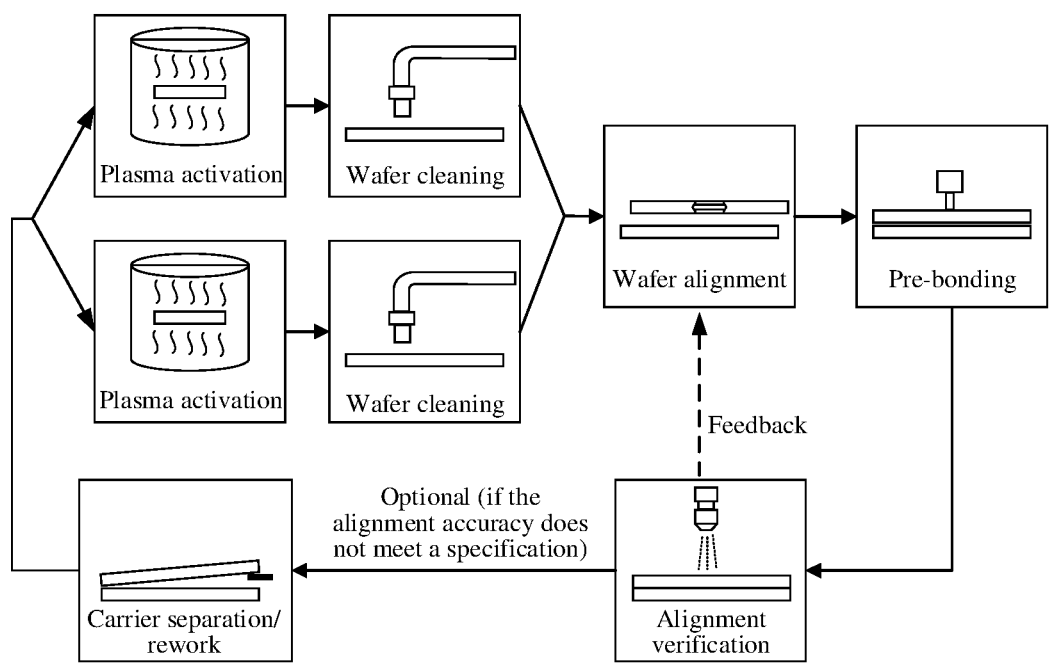
FIG. 1 is a process flowchart of wafer bonding in some implementations.

1—First fixing apparatus, 2—Second fixing apparatus, 10—First wafer, 11—First alignment mark, 20—Second wafer, 21—Second alignment mark, 3—Reflection member, 31—First reflection surface, 32—Second reflection surface, 4—Mark reader, 5—Calculation apparatus, and 6—Heating apparatus.

DETAILED DESCRIPTION

The following describes the exemplary implementations disclosed by the embodiments of the disclosure in more detail with reference to the drawings. Although the drawings show exemplary implementations of the disclosure, it is to be understood that the disclosure may be implemented in various forms and shall not be limited by specific implementations described herein. On the contrary, providing these implementations is to understand the disclosure thoroughly, and the scope of the disclosure can be completely conveyed to those skilled in the art.

A number of specific details are given below to provide a more thorough understanding of the disclosure. However, it is apparent to those skilled in the art that the disclosure may be implemented without one or more of these details. In other examples, to avoid confusion with the disclosure, some technical features known in the art are not described. Namely, not all features of the actual embodiments are described here, and known functions and structures are not described in detail here.

In the drawings, dimensions of layers, areas, components and their relative dimensions may be exaggerated for clarity. The same reference numerals represent the same components throughout the disclosure.

It is to be understood that a description that an element or layer is "above", "adjacent to", "connected to", or "coupled to" another element or layer may refer to that the element or layer is directly above, adjacent to, connected to or coupled to the other element or layer, or there may be an intermediate element or layer. On the contrary, a description that an element is "directly on", "directly adjacent to", "directly connected to" or "directly coupled to" another element or layer refers to that there is no intermediate element or layer. It is to be understood that, although various elements, components, regions, layers and/or parts may be described with terms "first", "second", "third", etc., these elements, components, regions, layers and/or parts should not be limited by these terms. These terms are used only to distinguish one element, component, region, layer or part from another element, component, region, layer or part. Therefore, a first element, component, region, layer or part discussed below may be represented as a second element, component, region, layer or part without departing from the teaching of the disclosure. However, when discussing a second element, component, region, layer or part, it does not necessarily mean that a first element, component, region, layer or part is necessarily present in the disclosure.

Spatially relational terms such as "below", "under", "lower", "beneath", "above", and "upper" may be used herein for convenience of description to describe a relationship between one element or feature and another element or feature illustrated in the drawings. It is to be understood that, in addition to the orientation shown in the figures, the spatially relational terms are intended to further include different orientations of devices in use and operation. For example, if the devices in the figures are turned upside down, elements or features described as being "under" or "beneath" or "below" other elements or features will be oriented to be "on" the other elements or features. Therefore, the exemplary terms "under" and "below" may include both upper and lower orientations. The device may be otherwise oriented (rotated by 90 degrees or in other orientations) and the spatial descriptors used herein may be interpreted accordingly.

The terms used herein are for the purpose of describing specific embodiments only and not intended to limit the disclosure. As used herein, singular forms "a/an", "one", and "the" are also intended to include the plural forms, unless otherwise specified in the context. It is also to be understood that, when terms "composed of" and/or "including" are used in this specification, the presence of the features, integers, steps, operations, elements, and/or components is determined, but the presence or addition of one or more other features, integers, steps, operations, elements, components, and/or groups is not precluded. As used herein, term "and/or" includes any and all combinations of the related listed items.

In order to thoroughly understand the disclosure, detailed steps and detailed structure will be presented in the following description to explain the technical solution of the disclosure. Preferred embodiments of the disclosure are described in details below. However, in addition to these detailed descriptions, the disclosure may also have other implementation modes.

Figure 2:
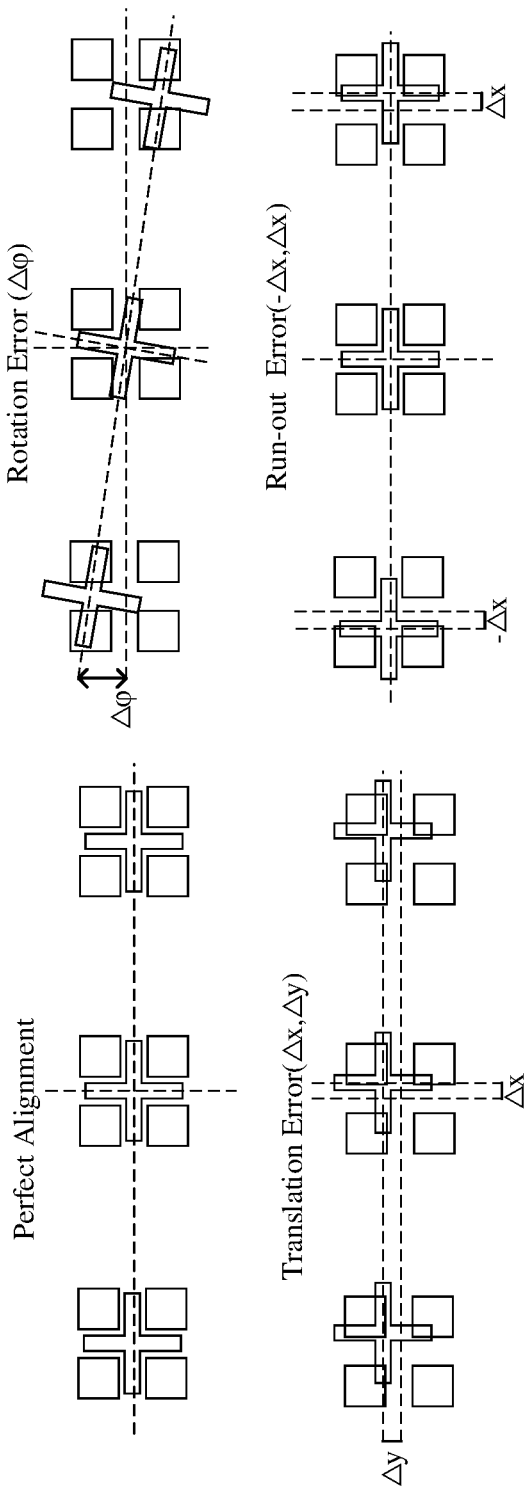
FIG. 2 is a schematic diagram of several offset errors during wafer bonding in some implementations.

FIG. 1 is a process flowchart of wafer bonding. The accuracy of wafer alignment needs to be controlled during wafer heterogeneous bonding, and therefore alignment patterns, namely, alignment marks, need to be designed on alignment surfaces of two wafers. FIG. 2 is a schematic diagram showing several kinds of offset errors during wafer bonding in some implementations. In some implementations, two cameras are used to aim at an upper wafer and a lower wafer, respectively, and a linear offset is compensated by moving the upper and lower wafers. However, this method can only compensate for the linear offset in alignment, but not for a non-linear offset.

Figure 3:
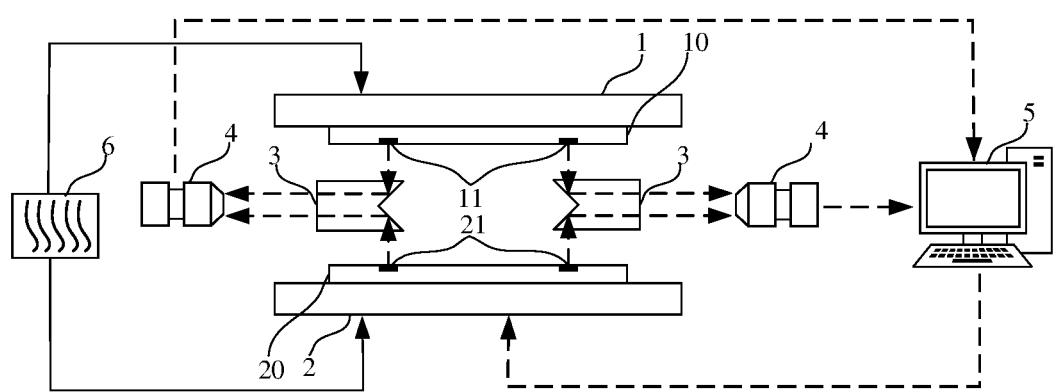
FIG. 3 is a structural schematic diagram of a wafer bonding device according to an embodiment of the disclosure.

On this basis, the embodiments of the disclosure provide a wafer bonding device. FIG. 3 is a structural schematic diagram of a wafer bonding device according to an embodiment of the disclosure.

Referring to FIG. 3, the wafer bonding device includes a first fixing apparatus 1, a second fixing apparatus 2, a reflection member 3, a mark reader 4, and a heating apparatus 6.

The first fixing apparatus 1 is configured to fix a first wafer 10. A first alignment mark 11 is disposed on the first wafer 10. The second fixing apparatus 2 is configured to fix a second wafer 20. A second alignment mark 21 is disposed on the second wafer 20. The second fixing apparatus 2 is disposed opposite to the first fixing apparatus 1. The reflection member 3 is located between the first fixing apparatus 1 and the second fixing apparatus 2. The mark reader 4 reads position information about the first alignment mark 11 and the second alignment mark 21 by means of the reflection member 3, for aligning the first wafer 10 fixed on the first fixing apparatus 1 with the second wafer 20 fixed on the second fixing apparatus 2. The heating apparatus 6 is configured to heat the first wafer 10 to thermally expand the first wafer 10 so that the first alignment mark 11 is located at a central position of a field of view of the mark reader 4, or, heat the second wafer 20 to thermally expand the second wafer 20 so that the second alignment mark 21 is located at a central position of a field of view of the mark reader 4.

In the embodiment of the disclosure, the first wafer and the second wafer are subjected to thermal expansion using the heating apparatus so as to compensate for non-linear errors in wafer alignment and improve the accuracy in wafer alignment.

Furthermore, in the embodiment of the disclosure, the alignment can be accomplished only by moving the wafer slightly without moving the mark reader, thereby improving the stability and accuracy in wafer alignment.

In the embodiment of the disclosure, the first fixing apparatus 1 and the second fixing apparatus 2 are heatable fixing apparatuses. The heating apparatus 6 first heats the first fixing apparatus 1 or the second fixing apparatus 2 to indirectly heat the first wafer 10 or the second wafer 20.

Figure 4:
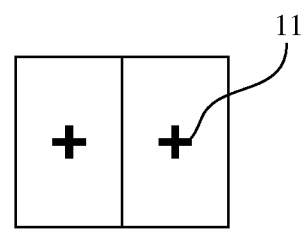
FIG. 4 is a schematic diagram of a first alignment mark according to an embodiment of the disclosure.

FIG. 4 is a schematic diagram of a first alignment mark according to an embodiment of the disclosure. The first alignment mark 11 shown in the figure has a cross shape. In another embodiment, the first alignment mark may have a shape selected from one of a short-straight-line shape, a circle shape or a ring shape. Only the first alignment mark 11 is shown in FIG. 4, and the second alignment mark 21 has the same shape as the first alignment mark 11. In the embodiment of the disclosure, the shapes of the first alignment mark 11 and the second alignment mark 21 are not particularly limited, and are designed based on the actual requirements.

The first alignment mark 11 and the second alignment mark 21 are made of a metal or other materials which are sensitive to light, so that the light sensitivity of the first alignment mark 11 and the second alignment mark 21 is enhanced, and the reading accuracy is further improved.

In the embodiment of the disclosure, the first wafer 10 and the second wafer 20 are moved, or the first wafer 10 or the second wafer 20 is thermally expanded by heating so that the first alignment mark 11 and the second alignment mark 21 are located at a central position of the field of view of the mark reader 4, so as to achieve the purpose of aligning the first wafer 10 fixed on the first fixing apparatus 1 with the second wafer 20 fixed on the second fixing apparatus 2.

In one embodiment, the operation that the mark reader 4 reads position information about the first alignment mark 11 and the second alignment mark 21 by means of the reflection member 3 includes that: position information about the first alignment mark 11 and position information about the second alignment mark 21 are read simultaneously. Reading the position information about the first alignment mark and the second alignment mark simultaneously may improve the stability and accuracy of information reading, compared to reading the position information about the first alignment mark and the second alignment mark separately. However, it is to be understood that in other embodiments, the position information about the first alignment mark and the second alignment mark may be read separately.

In one embodiment, there are two or more first alignment marks 11 and two or more second alignment marks 21. Two or more first alignment marks and second alignment marks may improve the accuracy of wafer alignment by combining the lateral and longitudinal alignment accuracy during alignment.

The number of the first alignment marks 11 may be equal to the number of the second alignment marks 21.

In the present embodiment, the mark reader 4 is an optical reader. The optical reader is configured to emit light to directly read the position information about the first alignment mark 11 or the second alignment mark 21 when the first fixing apparatus 1 or the second fixing apparatus 2 is moved to a preset position. Moreover, the light emitted from the mark reader 4 is a far infrared light. When the light emitted from the mark reader 4 is the far infrared light, the light emitted from the mark reader 4 has a strong penetrability, so that the reading capability of the mark reader 4 can be improved.

Specifically, the operation that the mark reader 4 reads the position information about the first alignment mark 11 and the second alignment mark 21 by means of the reflection member 3 includes that: detection light is incident on the first alignment mark 11 and the second alignment mark 21, the first alignment mark 11 and the second alignment mark 21 reflect the detection light, and the reflected detection light enters the mark reader 4 after being reflected by the reflection member 3 so that the position information about the first alignment mark 11 and the second alignment mark 21 is read.

There are two or more mark readers 4.

Figure 5:
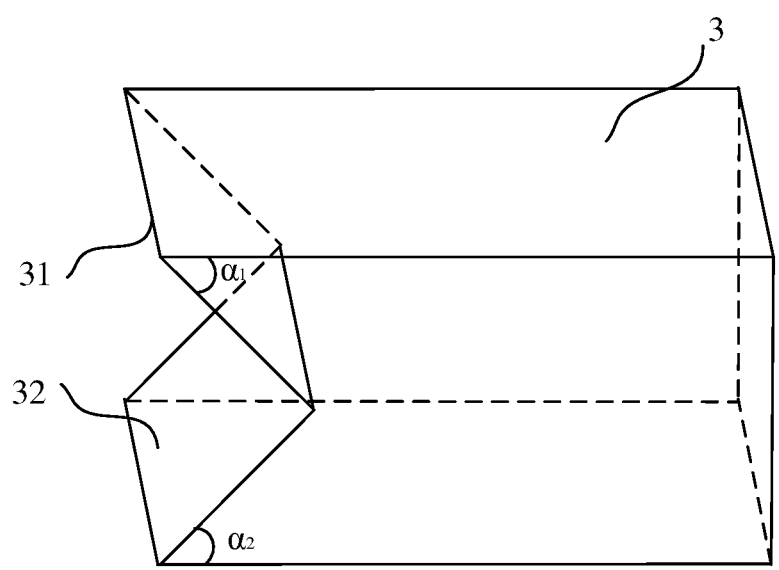
FIG. 5 is a three-dimensional diagram of a reflection member in a wafer bonding device according to an embodiment of the disclosure.

FIG. 5 is a three-dimensional diagram of a reflection member in a wafer bonding device according to an embodiment of the disclosure. In the embodiment of the disclosure, the reflection member 3 resembles a reflective glass of a digital single lens reflex camera.

In one embodiment, the reflection member 3 includes a first reflection surface 31 and a second reflection surface 32. The detection light reflected by the first alignment mark 11 enters the mark reader 4 after being reflected by the first reflection surface 31. The detection light reflected by the second alignment mark 21 enters the mark reader 4 after being reflected by the second reflection surface 32.

Continuing to refer to FIG. 5, the reflection member 3 is in a shape of a symbol of "Σ".

A reflection layer is formed on each of the first reflection surface 31 and the second reflection surface 32. Specifically, the surfaces of outer layers of the first reflection surface 31 and the second reflection surface 32 are coated with the reflection layers so that the detection light, when being reflected to the surfaces of inner layers of the first reflection surface 31 and the second reflection surface 32, does not directly penetrate through the first reflection surface and the second reflection surface, but is reflected to the reader marker.

An included angle between the first reflection surface and the plane of the first wafer is 45°. An included angle between the second reflection surface and the plane of the second wafer is 45°.

Specifically, referring to FIG. 5, the included angle between the first reflection surface 31 and the plane of the first wafer 10 is $\alpha_1$ in this figure, and the included angle between the second reflection surface 32 and the plane of the second wafer 20 is $\alpha_2$ in this figure. $\alpha_1$ and $\alpha_2$ are set to be 45°. When the detection light is vertically reflected to the first reflection surface and the second reflection surface, the reflected detection light is horizontally reflected to the mark reader, so as to ensure the accuracy of the read position information and improve the accuracy of alignment.

In one embodiment, the wafer bonding device further includes: a calculation apparatus 5 configured to calculate the position information about the first alignment mark 11 and the second alignment mark 21 read by the mark reader 4. The first wafer 10 fixed on the first fixing apparatus 1 and the second wafer 20 fixed on the second fixing apparatus 2 are aligned responsive to a calculation result.

Specifically, the calculation apparatus 5 calculates an offset between the position information about the first alignment mark 11 and the second alignment mark 21 read by the mark reader 4 and the central position of the field of view of the mark reader 4, and the first fixing apparatus 1 or the second fixing apparatus 2 is moved responsive to the calculation result, so as to align the first wafer 10 with the second wafer 20.

Figure 6:
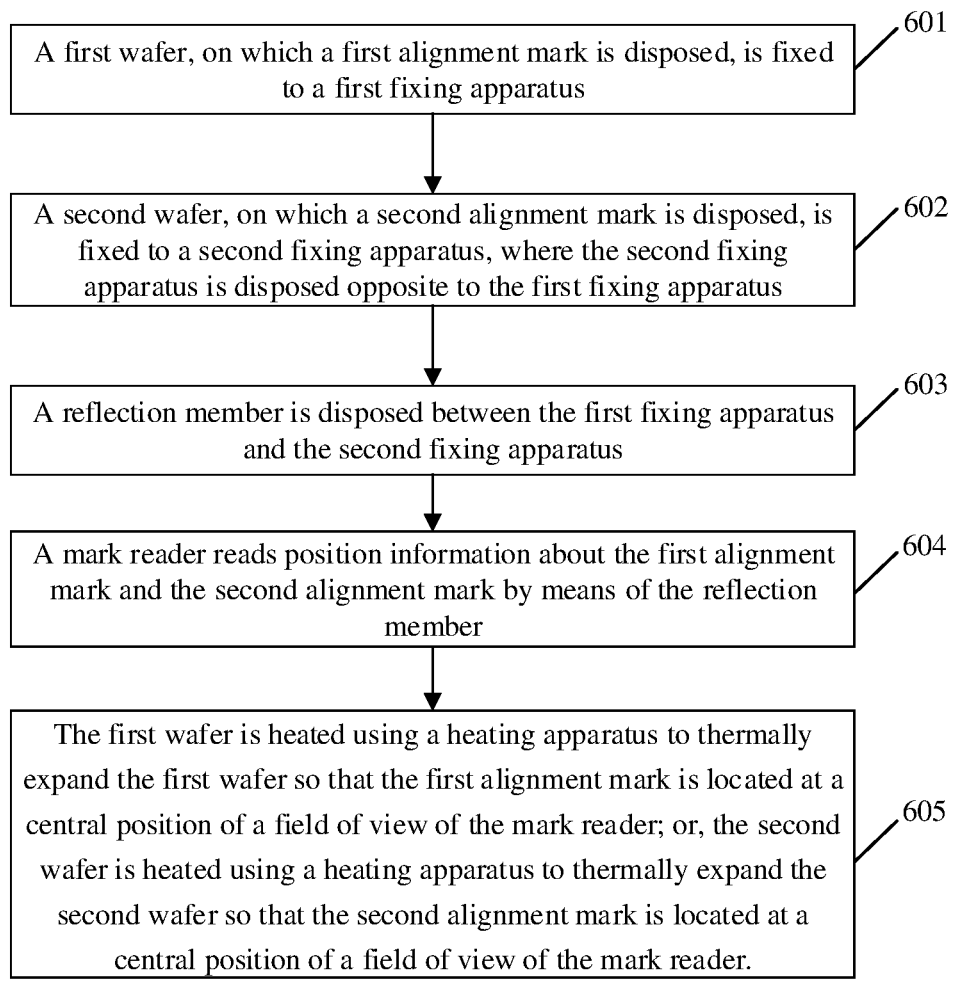
FIG. 6 is a flowchart of a wafer bonding method according to an embodiment of the disclosure.

The embodiments of the disclosure further provide a wafer bonding method implemented by a device as described in any of the above embodiments. Specifically, referring to FIG. 6, the method including the following steps.

At S601, a first wafer, on which a first alignment mark is disposed, is fixed to a first fixing apparatus.

At S602, a second wafer, on which a second alignment mark is disposed, is fixed to a second fixing apparatus. The second fixing apparatus is disposed opposite to the first fixing apparatus.

At S603, a reflection member is disposed between the first fixing apparatus and the second fixing apparatus.

At S604, a mark reader reads position information about the first alignment mark and the second alignment mark by means of the reflection member.

At S605, the first wafer is heated using a heating apparatus to thermally expand the first wafer so that the first alignment mark is located at a central position of a field of view of the mark reader; or, the second wafer is heated using a heating apparatus to thermally expand the second wafer so that the second alignment mark is located at a central position of a field of view of the mark reader.

Further detailed description is made to the wafer bonding method in the embodiment of the disclosure below with reference to specific embodiments.

Figure 7A:
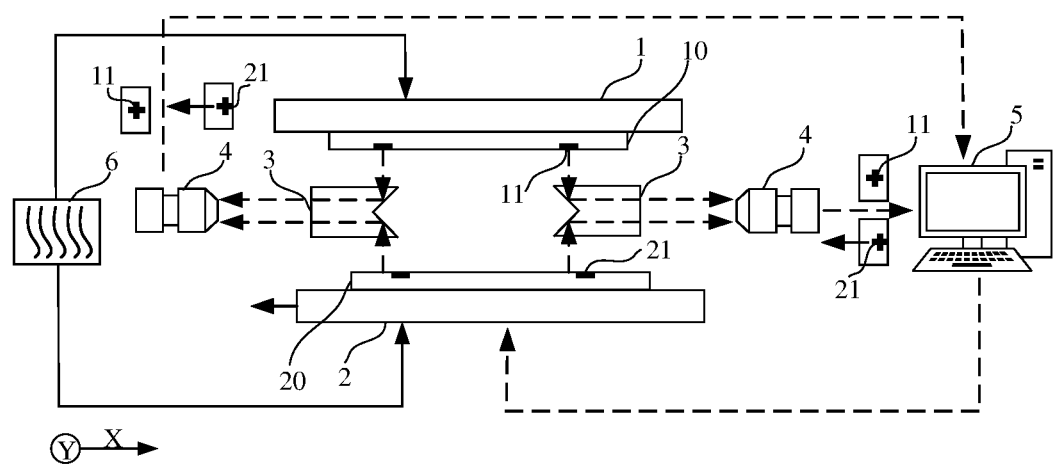
FIG. 7A is a first schematic diagram of an alignment process of a wafer bonding method according to an embodiment of the disclosure.
Figure 7B:
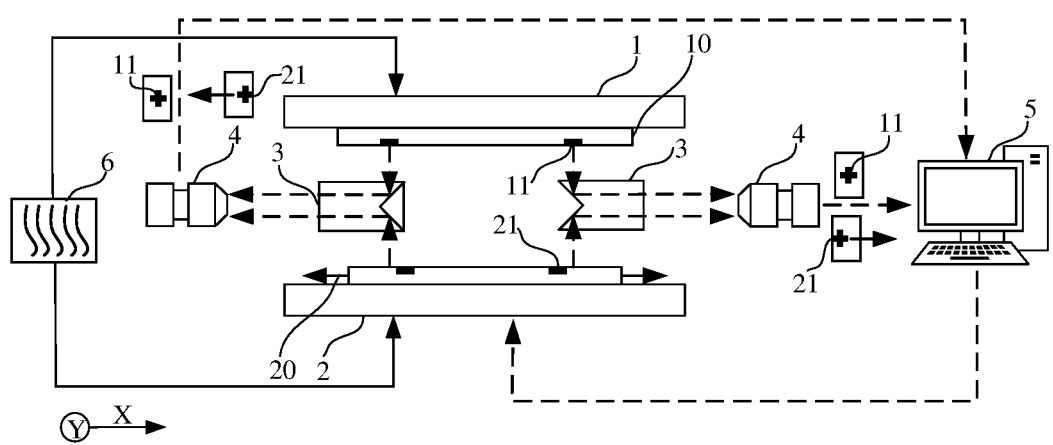
FIG. 7B is a second schematic diagram of an alignment process of a wafer bonding method according to an embodiment of the disclosure.

FIGS. 7A-7B are schematic diagrams of an alignment process of a wafer bonding method according to an embodiment of the disclosure.

First, referring to FIG. 7A, steps 601-602 are executed. A first wafer 10, on which a first alignment mark 11 is disposed, is fixed to a first fixing apparatus 1. A second wafer 20, on which a second alignment mark 21 is disposed, is fixed to a second fixing apparatus 2. The second fixing apparatus 2 is disposed opposite to the first fixing apparatus 1.

FIG. 4 is a schematic diagram of a first alignment mark according to an embodiment of the disclosure. The first alignment mark 11 shown in the figure is cross-shaped. In another embodiment, the first alignment mark may have a shape selected from one of a short-straight-line shape, a circle shape or a ring shape. Only the first alignment mark 11 is shown in FIG. 4, and the second alignment mark 21 has the same shape as the first alignment mark 11. In the embodiment of the disclosure, the shapes of the first alignment mark 11 and the second alignment mark 21 are not particularly limited, and are designed based on the actual requirements.

The first alignment mark 11 and the second alignment mark 21 are made of a metal or other materials which are sensitive to light, so that the light sensitivity of the first alignment mark 11 and the second alignment mark 21 is enhanced, and the reading accuracy is further improved.

In the embodiment of the disclosure, the first wafer 10 and the second wafer 20 are moved, or the first wafer 10 or the second wafer 20 is thermally expanded by heating so that the first alignment mark 11 and the second alignment mark 21 are located at a central position of the field of view of the mark reader 4, so as to achieve the purpose of aligning the first wafer 10 fixed on the first fixing apparatus 1 and the second wafer 20 fixed on the second fixing apparatus 2.

In one embodiment, there are two or more first alignment marks 11 and two or more second alignment marks 21. Two or more first alignment marks and second alignment marks may improve the accuracy of wafer alignment by combining the lateral and longitudinal alignment accuracy during alignment.

The number of the first alignment marks 11 may be equal to the number of the second alignment marks 21.

Continuing to refer to FIG. 7A, S603 is executed. A reflection member 3 is disposed between the first fixing apparatus 1 and the second fixing apparatus 2.

FIG. 5 is a three-dimensional diagram of a reflection member in a wafer bonding device according to an embodiment of the disclosure. In the embodiment of the disclosure, the reflection member 3 resembles a reflective glass of a digital single lens reflex camera.

In one embodiment, the reflection member 3 is in a shape of a symbol of "Σ".

Continuing to refer to FIG. 5, the reflection member 3 includes a first reflection surface 31 and a second reflection surface 32.

A reflection layer is formed on each of the first reflection surface 31 and the second reflection surface 32. Specifically, the surfaces of outer layers of the first reflection surface 31 and the second reflection surface 32 are coated with the reflection layers so that the detection light, when reflected to the surfaces of inner layers of the first reflection surface 31 and the second reflection surface 32, does not directly penetrate through the first reflection surface and the second reflection surface but is reflected to the reader marker.

An included angle between the first reflection surface and the plane of the first wafer is 45°. An included angle between the second reflection surface and the plane of the second wafer is 45°.

Specifically, referring to FIG. 5, the included angle between the first reflection surface 31 and the plane of the first wafer 10 is $\alpha_1$ in this figure, and the included angle between the second reflection surface 32 and the plane of the second wafer 20 is $\alpha_2$ in this figure. $\alpha_1$ and $\alpha_2$ are set to be 45°. When the detection light is vertically reflected to the first reflection surface and the second reflection surface, the reflected detection light is horizontally reflected to the mark reader, so as to ensure the accuracy of the read position information and improve the accuracy of alignment.

Continuing to refer to FIG. 7A, step 604 is executed. A mark reader 4 reads position information about the first alignment mark 11 and the second alignment mark 21 by means of the reflection member 3.

In one embodiment, the operation that the mark reader 4 reads position information about the first alignment mark 11 and the second alignment mark 21 by means of the reflection member 3 includes that: position information about the first alignment mark 11 and position information about the second alignment mark 21 are read simultaneously. Reading the position information about the first alignment mark and the second alignment mark simultaneously may improve the stability and accuracy of information reading compared to reading the position information about the first alignment mark and the second alignment mark separately. However, it is to be understood that in other embodiments, the position information about the first alignment mark and the second alignment mark may be read separately.

In the present embodiment, the mark reader 4 is an optical reader. The optical reader is configured to emit light to directly read the position information about the first alignment mark 11 or the second alignment mark 21 when the first fixing apparatus 1 or the second fixing apparatus 2 is moved to a preset position. Moreover, the light emitted from the mark reader 4 is far infrared light. When the light emitted from the mark reader 4 is the far infrared light, the light emitted from the mark reader 4 has a strong penetrability, so that the reading capability of the mark reader 4 can be improved.

Specifically, the operation that the mark reader 4 reads the position information about the first alignment mark 11 and the second alignment mark 21 by means of the reflection member 3 includes that: detection light is incident on the first alignment mark 11 and the second alignment mark 21, the first alignment mark 11 and the second alignment mark 21 reflect the detection light, and the reflected detection light enters the mark reader 4 after being reflected by the reflection member 3 so that the position information about the first alignment mark 11 and the second alignment mark 21 is read.

There are two or more mark readers 4.

In one embodiment, the detection light reflected by the first alignment mark 11 enters the mark reader 4 after being reflected by the first reflection surface 31. The detection light reflected by the second alignment mark 21 enters the mark reader 4 after being reflected by the second reflection surface 32.

Continuing to refer to FIG. 7A, S605 is executed. The first wafer 10 is heated using a heating apparatus 6 to thermally expand the first wafer 10 so that the first alignment mark 11 is located at a central position of the field of view of the mark reader 4; or, the second wafer 20 is heated using a heating apparatus 6 to thermally expand the second wafer 20 so that the second alignment mark 21 is located at a central position of the field of view of the mark reader 4.

Specifically, the first fixing apparatus 1 and the second fixing apparatus 2 are heating fixing apparatuses. The heating apparatus 6 first heats the first fixing apparatus 1 or the second fixing apparatus 2 to indirectly heat the first wafer 10 or the second wafer 20.

After the mark reader 4 reads the position information about the first alignment mark 11 and the second alignment mark 21 by means of the reflection member 3, the method further includes the following operations.

An offset between the position information about the first alignment mark 11 and the second alignment mark 21 read by the mark reader 4 and the central position of the field of view of the mark reader 4 is calculated using a calculation apparatus 5, and the first fixing apparatus 1 or the second fixing apparatus 2 is moved responsive to the calculation result, so as to align the first wafer 10 with the second wafer 20.

In the present embodiment, the first fixing apparatus or the second fixing apparatus is moved in the X or Y direction to align the first wafer with the second wafer. As shown in FIG. 7A, the alignment process of the first wafer 10 and the second wafer 20 is described by taking moving the second fixing apparatus 2 in the X direction as an example.

As shown in FIG. 7A, when the mark reader 4 reads that the first alignment mark 11 is located at the central position of the field of view of the mark reader 4 but the position of the second alignment mark 21 is offset to the right side of the field of view of the mark reader 4 in the X direction, the calculation apparatus 5 calculates an offset between the position information about the second alignment mark 21 read by the mark reader 4 and the central position of the field of view of the mark reader 4, and responsive to the calculation result, the second fixing apparatus 2 is moved to the left in the X direction until the second alignment mark 21 is located at the central position of the field of view of the mark reader 4. At this time, the alignment process of the first wafer 10 and the second wafer 20 is completed, then the reflection member 3 is removed, and the first wafer 10 and the second wafer 20 are bonded.

It is to be noted that in FIG. 7A, only an example of moving the second fixing apparatus in the X direction is shown, but the alignment process of the first wafer and the second wafer further includes a process of moving the first fixing apparatus and the second fixing apparatus in the Y direction.

As shown in FIG. 7B, the alignment process of the first wafer 10 and the second wafer 20 is described by taking a non-linear offset existing in the second wafer 20 as an example.

As shown in FIG. 7B, when the mark reader 4 reads that the first alignment mark is located at the central position of the field of view of the mark reader 4, and in the X direction, the position of the second alignment mark 21, on the left side, of the second wafer 20 is offset to the right side of the field of view of the mark reader 4, and the position of the second alignment mark 21, on the right side, of the second wafer 20 is offset to the left side of the field of view of the mark reader 4, the calculation apparatus 5 calculates the offset amount between the position information about the second alignment mark 21 read by the mark reader 4 and the central position of the field of view of the mark reader 4, and according to the calculation result, the second wafer 20 is heated so as to thermally expand the second wafer until the second alignment mark 21 is located at the central position of the field of view of the mark reader 4. At this time, the alignment process of the first wafer 10 and the second wafer 20 is completed, the reflection member 3 is then removed, and the first wafer 10 and the second wafer 20 are bonded.

The above description is only preferred embodiments of the disclosure and not intended to limit the protection scope of the disclosure. Any modifications, equivalent replacements, improvements and the like made within the spirit and principle of the disclosure shall fall within the protection scope of the disclosure.

In the embodiments of the disclosure, the first wafer and the second wafer are subjected to thermal expansion using the heating apparatus so as to compensate for non-linear errors in wafer alignment and improve the accuracy in wafer alignment.

What is claimed is:

1. A wafer bonding device, comprising:
   a first fixing apparatus, configured to fix a first wafer, wherein a first alignment mark is disposed on the first wafer;
   a second fixing apparatus, configured to fix a second wafer, wherein a second alignment mark is disposed on the second wafer, and the second fixing apparatus is disposed opposite to the first fixing apparatus;
   a reflection member, located between the first fixing apparatus and the second fixing apparatus;
   a mark reader which reads position information about the first alignment mark and the second alignment mark by means of the reflection member, for aligning the first wafer fixed on the first fixing apparatus with the second wafer fixed on the second fixing apparatus; and
   a heating apparatus, configured to
      heat the first wafer to thermally expand the first wafer so that the first alignment mark is located at a central position of a field of view of the mark reader; or,
      heat the second wafer to thermally expand the second wafer so that the second alignment mark is located at a central position of a field of view of the mark reader;
   wherein
   the reflection member is in a shape of a symbol of "Σ".

2. The wafer bonding device of claim 1, wherein there are two or more first alignment marks and two or more second alignment marks.

3. The wafer bonding device of claim 1, wherein the mark reader reads position information about the first alignment mark and the second alignment mark by means of the reflection member in a manner comprising the following operations:
   detection light is incident on the first alignment mark and the second alignment mark, the first alignment mark and the second alignment mark reflect the detection light, and the reflected detection light enters the mark reader after being reflected by the reflection member so that the position information about the first alignment mark and the second alignment mark is read.

4. The wafer bonding device of claim 3, wherein the reflection member comprises a first reflection surface and a second reflection surface,
   the detection light reflected by the first alignment mark enters the mark reader after being reflected by the first reflection surface, and the detection light reflected by the second alignment mark enters the mark reader after being reflected by the second reflection surface.

5. The wafer bonding device of claim 4, wherein
an included angle between the first reflection surface and the plane of the first wafer is 45°, and
an included angle between the second reflection surface and the plane of the second wafer is 45°.

6. The wafer bonding device of claim 4, wherein
a reflection layer is formed on each of the first reflection surface and the second reflection surface.

7. The wafer bonding device of claim 1, further comprising:
a calculation apparatus, configured to calculate an offset between the position information about the first alignment mark and the second alignment mark read by the mark reader and the central position of the field of view of the mark reader, wherein the first wafer fixed on the first fixing apparatus and the second wafer fixed on the second fixing apparatus are aligned responsive to a calculation result.

8. A wafer bonding method using a wafer bonding device, comprising:
fixing a first wafer on which a first alignment mark is disposed, to a first fixing apparatus;
fixing a second wafer on which a second alignment mark is disposed, to a second fixing apparatus, wherein the second fixing apparatus is disposed opposite to the first fixing apparatus;
disposing a reflection member between the first fixing apparatus and the second fixing apparatus;
reading, using a mark reader, position information about the first alignment mark and the second alignment mark by means of the reflection member; and
heating the first wafer using a heating apparatus to thermally expand the first wafer so that the first alignment mark is located at a central position of a field of view of the mark reader, or
heating the second wafer using a heating apparatus to thermally expand the second wafer so that the second alignment mark is located at a central position of a field of view of the mark reader;
wherein
the reflection member is in a shape of a symbol of "Σ".

9. The wafer bonding method of claim 8, wherein
there are two or more first alignment marks and two or more second alignment marks.

10. The wafer bonding method of claim 8, wherein
said reading, using a mark reader, position information about the first alignment mark and the second alignment mark by means of the reflection member, comprises the following operations:
detection light is incident on the first alignment mark and the second alignment mark, the first alignment mark and the second alignment mark reflect the detection light, and the reflected detection light enters the mark reader after being reflected by the reflection member so that the position information about the first alignment mark and the second alignment mark is read.

11. The wafer bonding method of claim 10, wherein
the reflection member comprises a first reflection surface and a second reflection surface,
the detection light reflected by the first alignment mark enters the mark reader after being reflected by the first reflection surface, and
the detection light reflected by the second alignment mark enters the mark reader after being reflected by the second reflection surface.

12. The wafer bonding method of claim 11, wherein
an included angle between the first reflection surface and the plane of the first wafer is 45°, and
an included angle between the second reflection surface and the plane of the second wafer is 45°.

13. The wafer bonding method of claim 11, wherein
a reflection layer is formed on each of the first reflection surface and the second reflection surface.

14. The wafer bonding method of claim 8, after the mark reader reads the position information about the first alignment mark and the second alignment mark by means of the reflection member, further comprising:
calculating, using a calculation apparatus, an offset between the position information about the first alignment mark and the second alignment mark read by the mark reader and the central position of the field of view of the mark reader, and aligning the first wafer fixed on the first fixing apparatus with the second wafer fixed on the second fixing apparatus responsive to a calculation result.

* * * * *